US008610437B2

(12) United States Patent
Oh

(10) Patent No.: US 8,610,437 B2
(45) Date of Patent: Dec. 17, 2013

(54) ORGANIC LIGHT EMITTING DIODE DISPLAY DEVICE AND METHOD OF DRIVING THE SAME

(75) Inventor: Eun-Jung Oh, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 487 days.

(21) Appl. No.: 12/805,713

(22) Filed: Aug. 16, 2010

(65) Prior Publication Data

US 2011/0037744 A1 Feb. 17, 2011

(30) Foreign Application Priority Data

Aug. 14, 2009 (KR) ........................ 10-2009-0075232

(51) Int. Cl.
*G01R 31/08* (2006.01)
*G01R 31/26* (2006.01)

(52) U.S. Cl.
USPC ...................................... 324/522; 324/760.01

(58) Field of Classification Search
None
See application file for complete search history.

(56) References Cited

U.S. PATENT DOCUMENTS

2003/0016361 A1* 1/2003 Mank et al. .................... 356/432
2005/0116245 A1* 6/2005 Aitken et al. .................... 257/99
2007/0029928 A1* 2/2007 Choi et al. .................... 313/504
2008/0079697 A1* 4/2008 Lee et al. ...................... 345/173
2008/0160864 A1* 7/2008 Song et al. ........................ 445/3
2008/0246463 A1* 10/2008 Sinton et al. .................. 324/157
2009/0221109 A1* 9/2009 Choi et al. ...................... 438/33
2009/0295277 A1* 12/2009 Logunov et al. .............. 313/504
2011/0014731 A1* 1/2011 Nguyen et al. .................. 438/26
2011/0242047 A1* 10/2011 Kim et al. ..................... 345/174
2012/0224244 A1* 9/2012 Park et al. ..................... 359/242

FOREIGN PATENT DOCUMENTS

KR 1020030061098 7/2003
KR 1020040088841 10/2004
KR 1020050022538 3/2005
KR 1020050031274 4/2005
KR 1020060028212 3/2006
KR 10-0724475 6/2007
KR 1020070062647 6/2007
KR 1020080002520 1/2008
KR 1020080049205 A 6/2008

* cited by examiner

*Primary Examiner* — Jermele M Hollington
(74) *Attorney, Agent, or Firm* — Robert E. Bushnell, Esq.

(57) ABSTRACT

An organic light emitting diode display device that includes a first substrate, a second substrate, a sealing material sealing a space between the first and second substrates and applied along an edge of the second substrate, an interconnection disposed inside the sealing material, and a test unit connected to both ends of the interconnection and configured to measure a preset voltage applied to the interconnection and compare the measured voltage with a reference voltage to determine whether a crack occurred in the sealing material or not. Further, the same effect can be obtained by measuring and comparing currents instead of the voltages.

22 Claims, 6 Drawing Sheets

ORGANIC LIGHT EMITTING DIODE DISPLAY DEVICE AND METHOD OF DRIVING THE SAME

CLAIM OF PRIORITY

This application makes reference to, incorporates into this specification the entire contents of, and claims all benefits accruing under 35 U.S.C. §119 from an application earlier filed in the Korean Intellectual Property Office filed on Aug. 14, 2009, and there duly assigned Serial No. 10-2009-0075232.

BACKGROUND OF THE INVENTION

1. Field of the Invention

Aspects of the present invention relate to an organic light emitting diode display device and a method for driving the same, which can easily discriminate whether or not a crack occurred in a sealing material, before abnormalities occur.

2. Description of the Related Art

Generally, organic light emitting diode display devices are emissive type displays which electrically excite fluorescent organic compounds to emit light. The organic light emitting diode display devices can be driven at a low voltage, can be reduced in thickness, and can solve problems of liquid crystal display devices related to a wide viewing angle and a rapid response speed. Therefore, studies on the organic light emitting diode display devices are being actively conducted.

Such an organic light emitting diode display device includes an organic emission layer formed on a glass substrate or a transparent insulating substrate equivalent to glass, and anodic and cathodic electrode layers respectively formed on and under the organic emission layer to apply a driving voltage to the organic emission layer.

In the organic light emitting diode display device having the above-described configuration, as positive and negative voltages are applied to the electrodes, holes injected from the electrode to which the positive voltage is applied move to the organic emission layer, and electrons are injected to the organic emission layer from the electrode to which the negative voltage is applied. Accordingly, the electrons and the holes are recombined in the organic emission layer to generate exitons. While the exitons change from the exited state to the ground state, organic matters of the organic emission layer emit light to implement a desirable image.

The configuration of a contemporary organic light emitting diode display device may be described as follows. The contemporary organic light emitting diode display device includes a stacked-structure thin film transistor and an organic light emitting diode constituted by a first electrode, an organic emission layer, and a second electrode, which are formed on a first substrate having transparency and insulating properties. The thin film transistor and the organic light emitting diode are electrically connected.

As a second substrate is joined to the first substrate having the thin film transistor and the organic light emitting diode formed thereon through a sealing material, the thin film transistor and the organic light emitting diode are sealed.

In general, the sealing material is applied along an edge of the first or second substrate, and is cured by applying heat to the sealing material in a state in which the first and second substrates are bonded to each other.

When a minute crack occurs in the sealing material, the display is not turned off immediately or an error does not occur immediately. But, the display is turned off after a predetermined time passes.

This is because air, oxygen, moisture and so on permeate into cells through the minute crack little by little to destroy the organic light emitting diode.

Therefore, it takes time to check why the display device has been out of order. Users may recognize that the display device has been suddenly out of order without any reason.

SUMMARY OF THE INVENTION

It is thereof an aspect of the present invention to provide an improved organic light emitting diode display device and a method for driving the organic light emitting diode display device.

It is another object of the present invention to provide an organic light emitting diode display device which can measure a voltage or current at both ends of an interconnection installed inside a sealing material to easily discriminate whether a crack occurred in a sealing material or not, before abnormalities occur.

According to an aspect of the present invention, an organic light emitting diode display device is constructed with a first substrate, a second substrate, a sealing material sealing a space between the first and second substrates and applied along an edge of the second substrate, an interconnection disposed inside the sealing material, and a test unit connected to both ends of the interconnection. The test unit is configured to measure a preset voltage applied to the interconnection and compare the measured voltage with a reference voltage to determine whether or not a crack occurred in the sealing material.

According to another aspect of the present invention, a method for driving an organic light emitting diode display device includes applying a preset voltage through both ends of an interconnection disposed inside a sealing material, measuring a voltage at the both ends of the interconnection, and comparing the measured voltage with a reference voltage to determine whether or not a crack occurred in the sealing material, depending on whether the measured voltage and the reference voltage are identical or not.

According to still another aspect of the present invention, an organic light emitting diode display device is constructed with a first substrate, a second substrate, a sealing material sealing a space between the first and second substrates and applied along an edge of the second substrate, an interconnection disposed inside the sealing material, and a test unit connected to both ends of the interconnection. The test unit is configured to measure a preset current applied to the interconnection and compare the measured current with a reference current to determine whether or not a crack occurred in the sealing material.

According to still yet another aspect of the present invention, a method for driving an organic light emitting diode display device includes applying a preset current through both ends of an interconnection disposed inside a sealing material, measuring a current at both ends of the interconnection; and comparing the measured current with a reference current to determine whether a crack occurred in the sealing material or not, depending on whether both of the currents are identical or not.

Additional aspects and/or advantages of the invention will be set forth in part in the description which follows and, in part, will be obvious from the description, or may be learned by practice of the invention.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
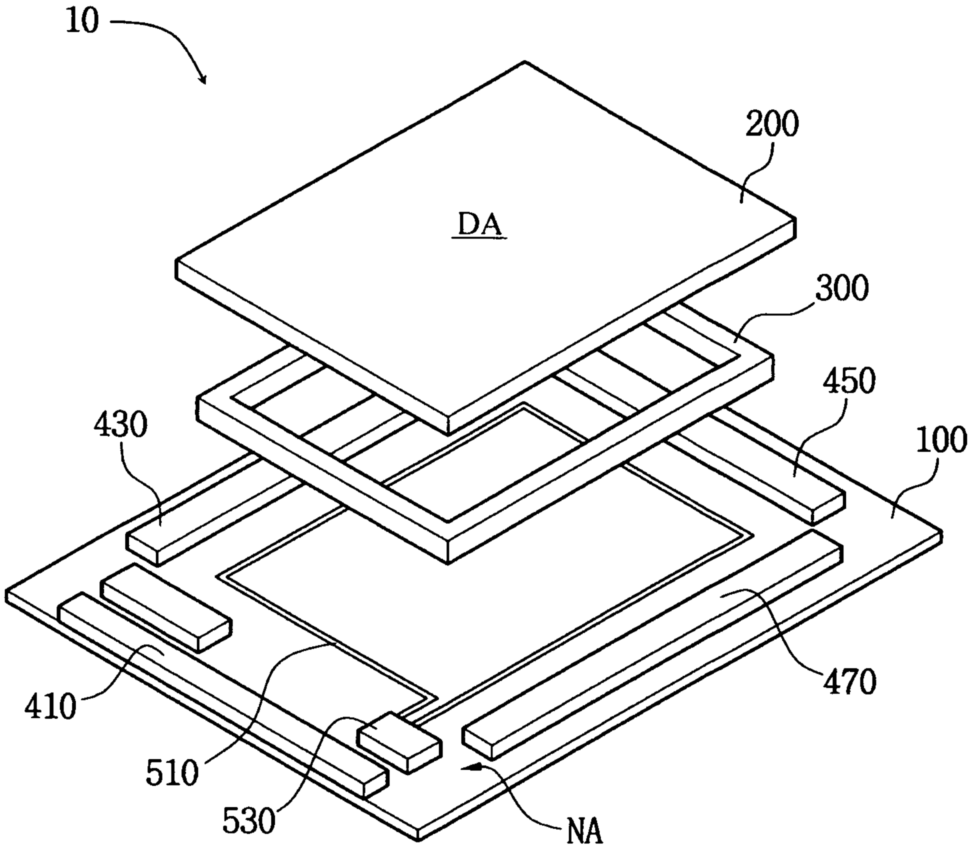
FIG. 1 is an exploded oblique view of an organic light emitting diode display device constructed as an exemplary embodiment according to the principles of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Hereinafter, an organic light emitting diode display device according to the present invention will be described with reference to the accompanying drawings which illustrate exemplary embodiments.

Figure 2:
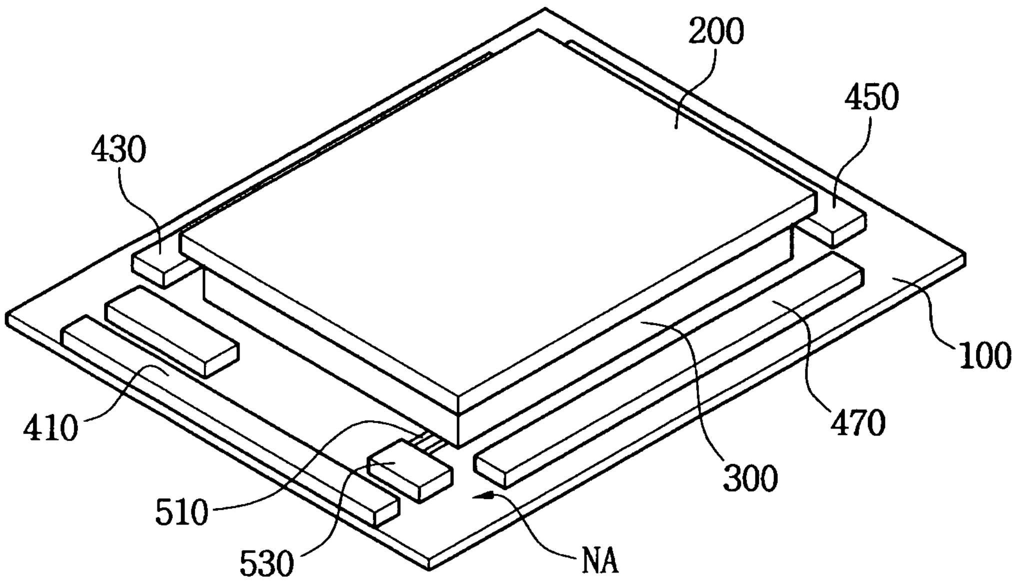
FIG. 2 is an assembled oblique view of the organic light emitting diode display device illustrated in FIG. 1 according to the exemplary embodiment of the principles of the present invention.
Figure 3:
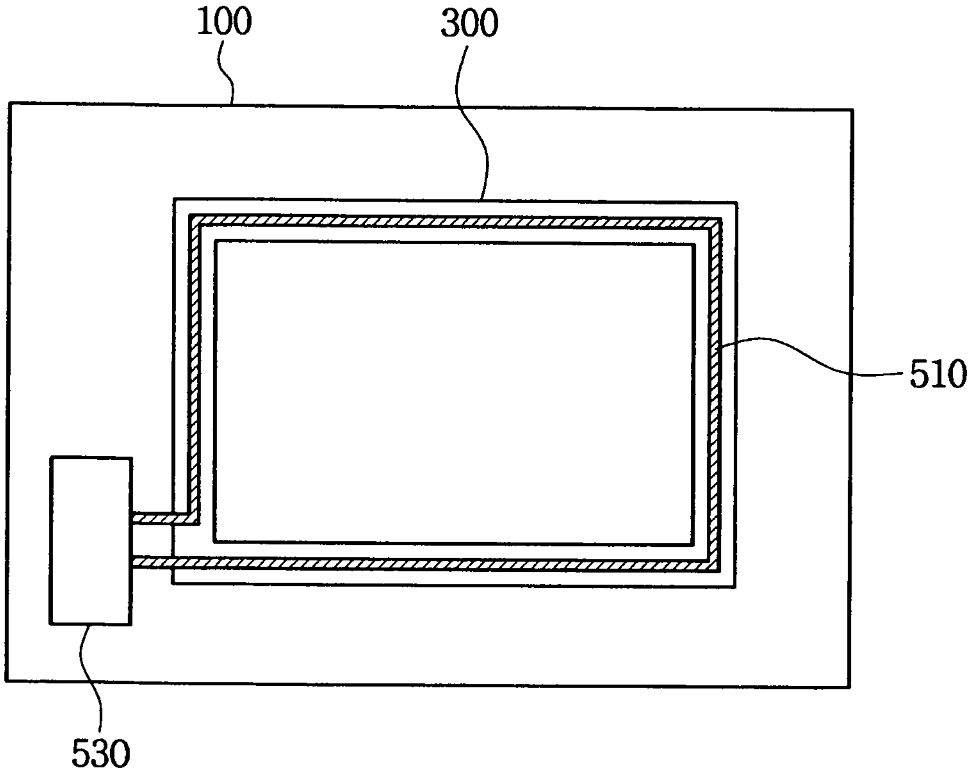
FIG. 3 is a plan view of the organic light emitting diode display device illustrated in FIG. 1 according to the exemplary embodiment of the principles of the present invention, showing the structure of an interconnection and a sealing material.
Figure 4:
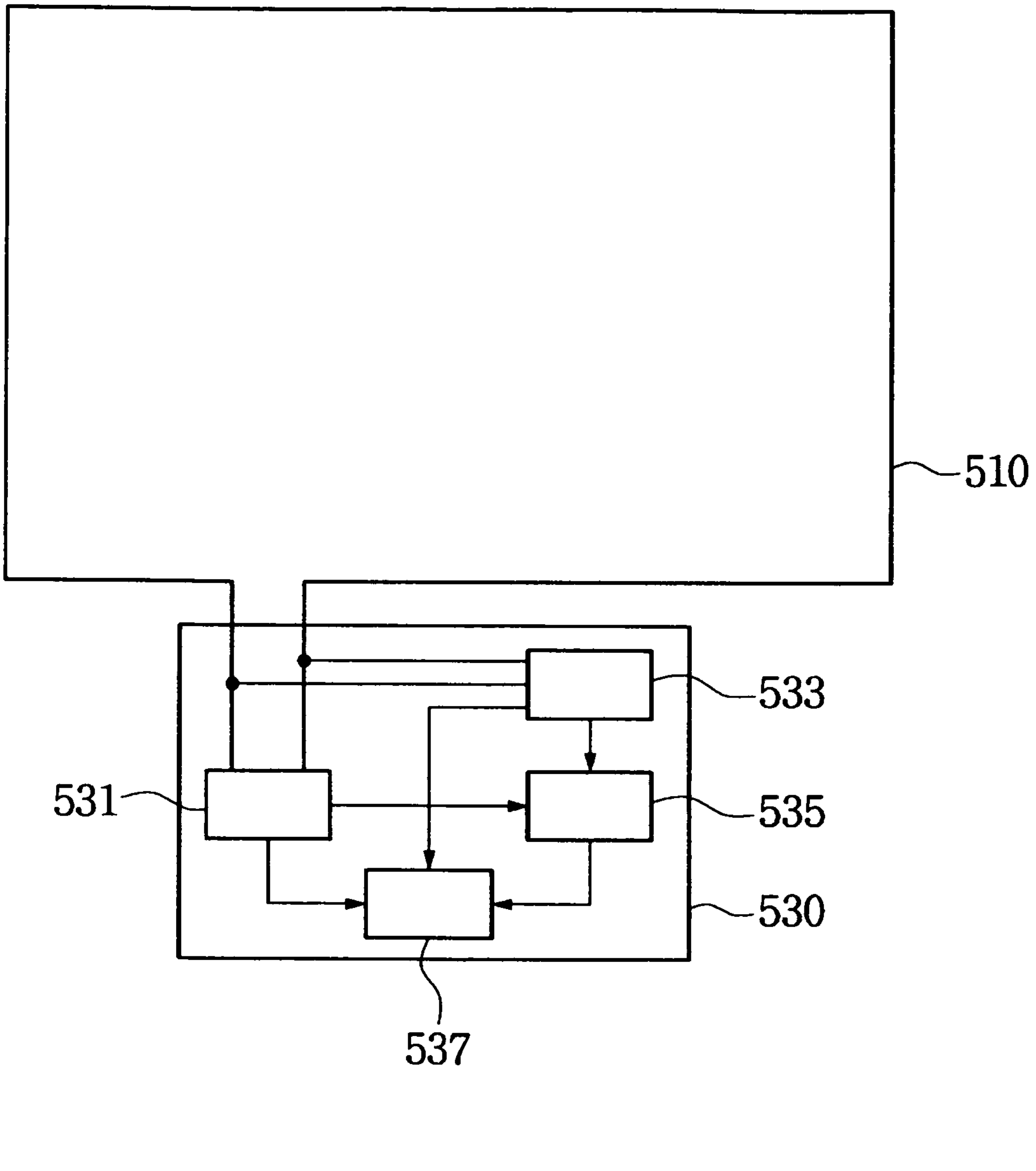
FIG. 4 is a block diagram of a test unit according to an exemplary embodiment of the principles of the present invention.
Figure 5:
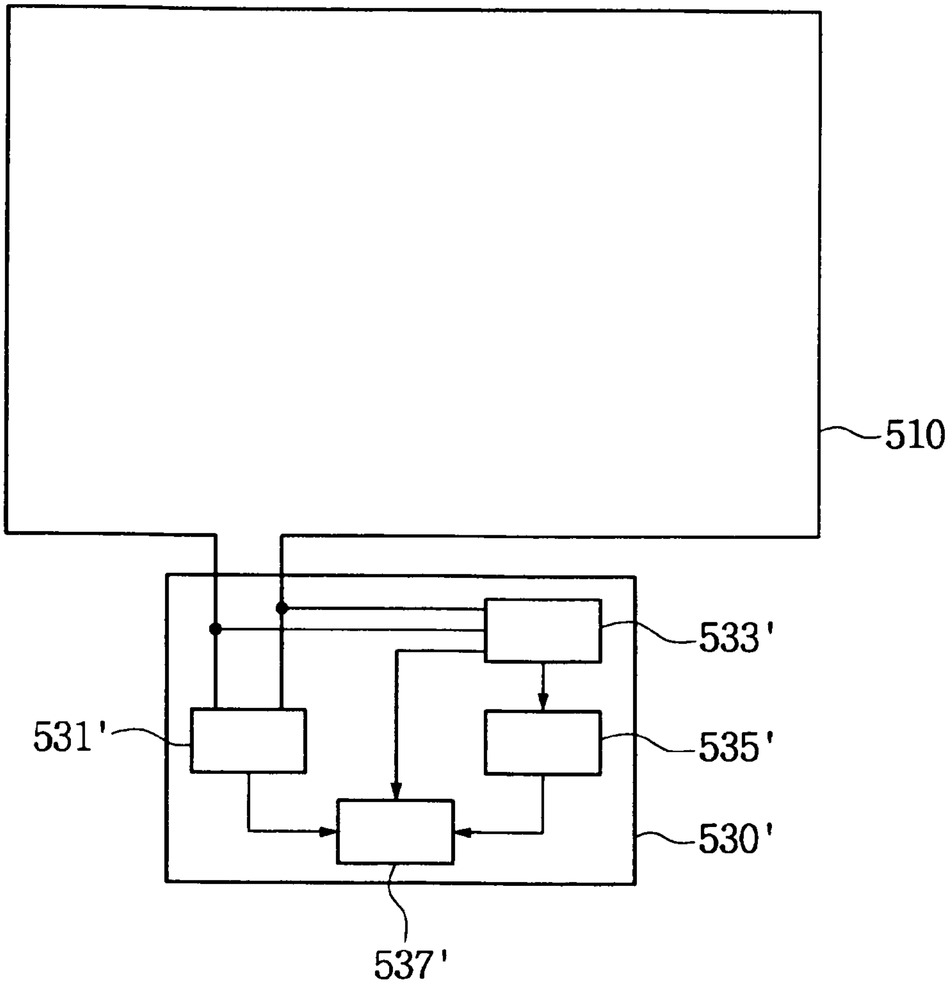
FIG. 5 is a block diagram of a test unit according to another exemplary embodiment of the principles of the present invention.
Figure 6:
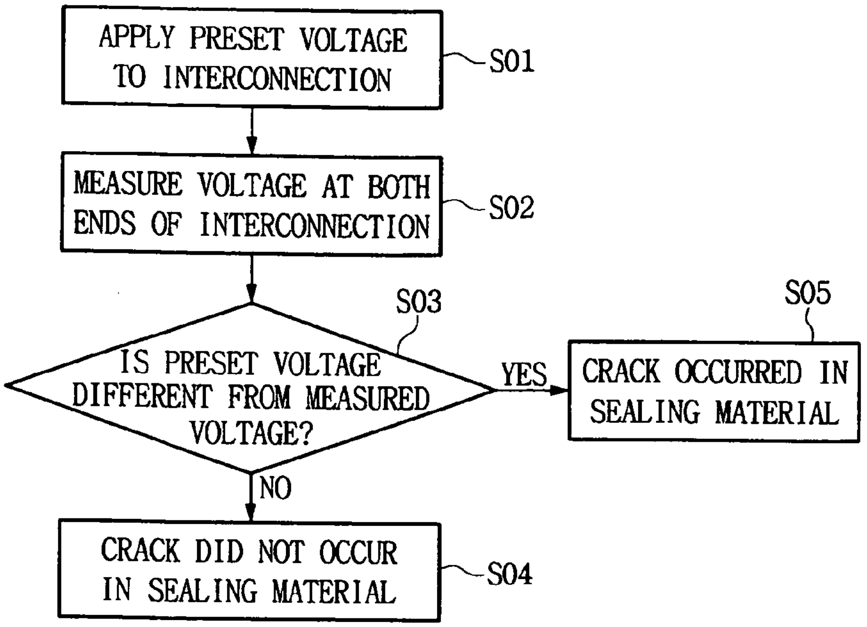
FIG. 6 is a flow chart for explaining an operation of the organic light emitting diode display device according to an exemplary embodiment of the principles of the present invention.
Figure 7:
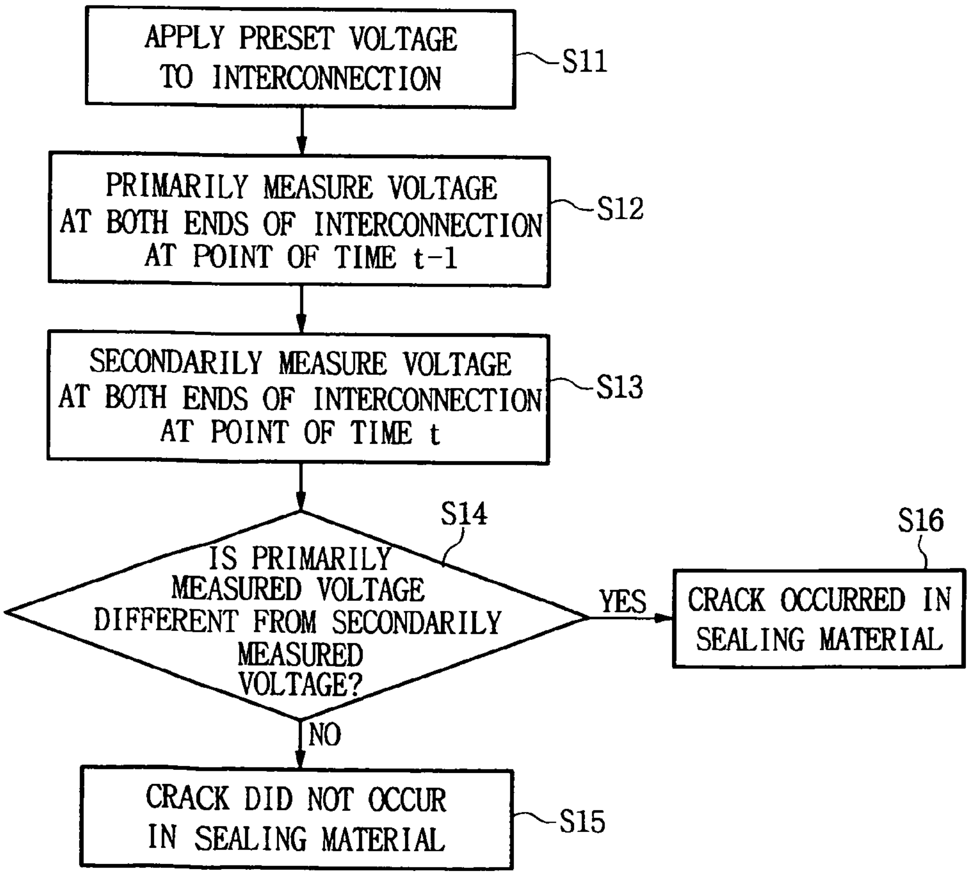
FIG. 7 is a flow charts for explaining an operation of the organic light emitting diode display device according to another exemplary embodiment of the principles of the present invention.

FIG. 1 is an exploded oblique view of an organic light emitting diode display device constructed as an exemplary embodiment according to the principles of the present invention. FIG. 2 is an assembled oblique view of the organic light emitting diode display device illustrated in FIG. 1 according to the exemplary embodiment of the principles of the present invention. FIG. 3 is a plan view of the organic light emitting diode display device illustrated in FIG. 1 according to the exemplary embodiment of the principles of the present invention, showing the structure of an interconnection and a sealing material. FIG. 4 is a block diagram of a test unit according to an exemplary embodiment of the principles of the present invention. FIG. 5 is a block diagram of a test unit according to another exemplary embodiment of the principles of the present invention. FIG. 6 is a flow chart for explaining an operation of the organic light emitting diode display device according to an exemplary embodiment of the principles of the present invention. FIG. 7 is a flow charts for explaining an operation of the organic light emitting diode display device according to another exemplary embodiment of the principles of the present invention.

Referring to FIGS. 1 to 3, organic light emitting diode display device 10 constructed as the exemplary embodiment according to the principles of the present invention includes a display area DA and a non-display area NA. Display area DA includes a first substrate 100, a second substrate 200, and one or more organic light emitting diodes (not shown) provided between first and second substrates 100 and 200, and displays an image in accordance with an external signal.

Organic light emitting diode display device 10 may be provided for the use of small-sized mobile devices such as mobile phones and plasma display panels (PDP) or large-sized display devices such as televisions.

Organic light emitting diode display device 10 may further include one or more thin film transistors (not shown) which are positioned between first and second substrates 100 and 200 and electrically connected to the respective organic light emitting diodes (not shown) to control the emission of light for the respective organic light emitting diodes (not shown).

Since the present invention can be applied regardless of which structure display area DA has, the detailed descriptions and illustrations of display area DA will be omitted herein.

At this time, a sealing material 300 such as frit is applied along an edge of second substrate 200, and is cured by applying heat to the applied sealing material 300, in order to join first and second substrates 100 and 200. Then, the space between first and second substrates 100 and 200 is sealed to protect the one or more organic light emitting diodes (not shown) from external gases, moisture, and air.

Non-display area NA is a region of first substrate 100 extending beyond second substrate 200, and includes various elements for controlling operations of the organic light emitting diodes (not shown) which display images in accordance with an external signal. The various elements include a pad unit 410 constituted by pads extending from the interconnection of display area DA, a scan driver 430, a data driver 450, an emission control driver 470 and so on.

Organic light emitting diode display device 10 includes a test unit 530 serving to check whether or not a crack occurred in sealing material 300. Organic light emitting diode display device 10 further includes interconnection 510 which is disposed inside sealing material 300 and non-display area NA. Test unit 530 is connected to both ends of interconnection 510 to measure a voltage at both ends of interconnection 510, and to compare the measured voltage with a reference voltage to determine whether or not a crack occurred in sealing material 300.

The thickness, width, and position of interconnection 510 may be selected properly by those skilled in the art depending on the thickness and width of sealing material 300.

As a method for disposing interconnection 510 inside sealing material 300, sealing material 300 may be applied to cover interconnection 510 in a state in which interconnection 510 is disposed to correspond to a position on first substrate 100 to which sealing material 300 is to be applied. However, the method is not limited thereto.

FIG. 4 is a block diagram of a test unit according to an exemplary embodiment of the principles of the present invention. FIG. 5 is a block diagram of a test unit according to another exemplary embodiment of the principles of the present invention. Referring to FIG. 4, test unit 530 may include a power supply section 531 which is connected to both ends of interconnection 510 to apply a preset voltage, a measuring section 533 which is connected to both ends of interconnection 510 to measure the applied preset voltage, and a determination section 535 which compares the preset voltage with the measured voltage to determine whether a crack occurred in sealing material 300 or not, depending on whether the preset voltage and the measured voltage are identical or not. Power supply section 531 may be a voltage source for supplying a voltage, and the preset voltage may be a reference voltage.

At this time, when the preset voltage is identical to the measured voltage, determination section 535 determines that a crack did not occur in sealing material 300. On the other hand, when the preset voltage is different from the measured voltage, determine section 535 determines that a crack occurred in sealing material 300. When a crack occurs in sealing material 300, reducing a unit area of sealing material 300 or short-circuiting in the interconnection disposed inside sealing material 300 is caused, the resistance of sealing material 300 is increased to reduce the voltage. Accordingly, depending on whether the preset voltage and the measured voltage are identical, it is determined whether a crack occurred in sealing material 300. Further, when the resistance is increased, the current is also increased. Thus, it is determined whether a crack occurred in sealing material 300 depending on whether the preset current and the measured current are identical, as described later.

Test unit 530 may further include a display section 537 for displaying a preset voltage applied from power supply section 531, a voltage measured by measuring section 533, and the determinations of determination section 535, that is, whether or not the preset voltage is identical to the measured, and whether or not a crack occurred.

In this exemplary embodiment, it has been described that test unit 530 measures the voltage at both ends of interconnection 510. In another exemplary embodiment according to the principles of the present invention as shown in FIG. 5, however, a test section 530' may measure a current flowing in both ends of interconnection 510 to determine whether or not a crack occurred in sealing material 300.

In this case, test unit 530' has the same configuration as that of test unit 530 of FIG. 4, except that the measured and compared values are not voltages but currents. Therefore, the detailed descriptions thereof will be omitted. Test unit 530' may be a current source for supplying a current, and a preset current may be a reference current.

Referring to FIG. 6, the operation of the organic light emitting diode display device according to an exemplary embodiment of the principles of the present invention will be described as follows. First, power supply section 531 applies a preset voltage to interconnection 510 disposed inside sealing material 300 for sealing the space between first and second substrates 100 and 200 (S01). Measuring section 533 measures a voltage at both ends of interconnection 510 (S02).

Determination section 535 compares the preset voltage with the measured voltage (S03). When the preset voltage and the measured voltage are different from each other, determination section 535 determines that a crack occurred in sealing material 300 (S05). When there is no difference between the voltages, the determination section 535 determines that a crack did not occur in sealing material 300 (S04). At this time, the preset voltage, the measured voltage, whether or not the present voltage and the measured voltage are identical to each other, and whether or not a crack occurred, may be displayed on display section 537.

Further, whether or not a crack occurred in sealing material 300 also may be checked by measuring currents using test unit 530' illustrated in FIG. 5. In this case, however, an operation method is identical to that of FIG. 6, except that the measured values are not voltages but currents. Therefore, a flow chart for checking whether or not a crack occurred in sealing material 300 by measuring currents will be omitted.

Referring to FIG. 5, power supply unit 531' is connected to both ends of interconnection 510 to apply a preset current, a measuring section 533' measures the applied preset current, and a determination section 535' compares the preset current with the measured current to determine whether or not a crack occurred in sealing material 300, depending on whether or not both of the currents are identical to each other.

In the above description, it has been exemplified that test unit 530 or 530' compares the preset voltage with the measured voltage, or compares the preset current with the measured current, to determine whether or not a crack occurred in sealing material 300.

However, test unit 530 or 530' may compare a currently measured voltage Vt with a previously measured voltage Vt-1, or compare a currently measured current It with a previously measured current It-1, to determine whether a crack occurred in sealing material 300 by checking whether or not a difference occurs between both of the voltages or currents.

Referring to FIG. 7, the operation of an organic light emitting diode display device according to another exemplary embodiment of the present invention will be described as follows. A power supply section 531 applies a preset voltage to an interconnection 510 disposed inside a sealing material 300 for sealing the space between first and second substrates 100 and 200 (S11). Measuring section 533 firstly measures a voltage at both ends of interconnection 510 at a point of time t-1 (S12).

At a point of time t after an arbitrary time passed, measuring section 533 secondarily measures a voltage at both ends of interconnection 510 (S13). Determination section 535 compares the primarily measured voltage with the secondarily measured voltage (S14). When both of the voltages are different from each other, determination section 535 determines that a crack occurred in sealing material 300 (S16). When there is no difference between the voltages, determination section 535 determines that a crack did not occur in sealing material 300 (S15). At this time, the firstly measured voltage, the secondarily measured voltage, whether or not the primarily measured voltage and the secondarily measured voltage are identical to each other, and whether or not a crack occurred may be displayed on a display section. The firstly measured voltage at the previous point of time t-1 may be a reference voltage.

In accordance with the flow chart of FIG. 6, whether or not a crack occurred in the sealing material can be determined by measuring and comparing currents. Similarly, in accordance with the flow chart of FIG. 7, whether or not a crack occurred in the sealing material can be also determined by measuring and comparing currents. In this case, a firstly measured current at a previous point of time t-1 may be a reference current.

Therefore, the occurrence of crack can be tested in real time depending on changes in voltage or current. Further, it is possible to test whether or not a crack occurred in the sealing material, before abnormalities occur in the device. Moreover, since the reference value, the measured value, and whether or not abnormalities occur during the test are displayed outside, it is easy to discriminate them.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting diode display device, comprising:

a first substrate;

a second substrate;

a sealing material sealing a space between the first and second substrates and applied along an edge of the second substrate;

an interconnection disposed inside the sealing material; and a test unit connected to both ends of the interconnection, said test unit measures a preset voltage applied to the interconnection, compares the measured voltage with a reference voltage and determines whether or not a crack occurred in the sealing material.

2. The organic light emitting diode display device according to claim 1, wherein the reference voltage is the preset voltage applied to the interconnection.

3. The organic light emitting diode display device according to claim 1, wherein the reference voltage is a voltage measured at a previous point of time.

4. The organic light emitting diode display device according to claim 3, wherein the test unit includes:

a power supply section connected to both ends of the interconnection and configured to apply the preset voltage;

a measuring section connected to said both ends of the interconnection and configured to measure the applied preset voltage; and a determination section configured to compare the reference voltage with the measured voltage to determine whether or not a crack occurred in the sealing member, depending on whether or not the reference voltage and the measured voltage are identical.

5. The organic light emitting diode display device according to claim 4, wherein the test unit further includes a display section configured to display the reference voltage, the measured voltage, whether or not the reference voltage and the measured voltage are identical, and whether or not a crack occurred in the sealing material.

6. The organic light emitting diode display device according to claim 2, wherein the test unit includes:

a power supply section connected to both ends of the interconnection and configured to apply the preset voltage;

a measuring section connected to both ends of the interconnection and configured to measure the applied preset voltage; and a determination section configured to compare the reference voltage with the measured voltage to determine whether or not a crack occurred in the sealing member, depending on whether or not the reference voltage and the measured voltage are identical.

7. The organic light emitting diode display device according to claim 6, wherein the test unit further includes a display section configured to display the reference voltage, the measured voltage, whether or not the reference voltage and the measured voltage are identical, and whether or not a crack occurred in the sealing material.

8. The organic light emitting diode display device according to claim 1, further comprising:

a display area including organic light emitting diodes formed between the first and second substrates; and a non-display area that is a region of the first substrate extending beyond the second substrate, wherein the test unit is disposed in the non-display area.

9. A method for driving an organic light emitting diode display device, comprising:

applying a preset voltage through both ends of an interconnection disposed inside a sealing material for sealing first and second substrate of the organic light emitting diode display device;

measuring a voltage at said both ends of the interconnection; and comparing the measured voltage with a reference voltage to determine whether or not a crack occurred in the sealing material, depending on whether or not the measured voltage and reference voltage are identical.

10. The method according to claim 9, wherein when the reference voltage is identical to the measured voltage, it is determined that a crack did not occur in the sealing material, and when the reference voltage is not identical to the measured voltage, it is determined that a crack occurred in the sealing material.

11. The method according to claim 9, wherein the reference voltage is the preset voltage.

12. The method according to claim 9, wherein the reference voltage is a voltage measured at a previous point of time.

13. An organic light emitting diode display device, comprising:

a first substrate;

a second substrate;

a sealing material sealing a space between the first and second substrates and applied along an edge of the second substrate;

an interconnection disposed inside the sealing material; and a test unit connected to both ends of the interconnection, said test unit measures a preset current applied to the interconnection, compares the measured current with a reference current and determines whether or not a crack occurred in the sealing material.

14. The organic light emitting diode display device according to claim 13, wherein the reference current is the preset current.

15. The organic light emitting diode display device according to claim 13, wherein the reference current is a current measured at a previous point of time.

16. The organic light emitting diode display device according to claim 14, wherein the test unit includes:

a power supply section connected to both ends of the interconnection and configured to apply the preset current;

a measuring section connected to said both ends of the interconnection and configured to measure the applied preset current; and a determination section configured to compare the reference current with the measured current, and to determine whether or not a crack occurred in the sealing member, depending on whether or not the reference current and the measured current are identical.

17. The organic light emitting diode display device according to claim 16, wherein the test unit further includes a display section configured to display the reference current, the measured current, whether or not the reference current and the measured current are identical, and whether or not a crack occurred in the sealing material.

18. The organic light emitting diode display device according to claim 13, further comprising:

a display area including organic light emitting diodes formed between the first and second substrates; and a non-display area that is a region of the first substrate extending beyond the second substrate, wherein the test unit is disposed in the non-display area.

19. A method for driving an organic light emitting diode display device, comprising:

applying a preset current through both ends of an interconnection disposed inside a sealing material;

measuring a current at said both ends of the interconnection; and comparing the measured current with a reference current to determine whether or not a crack occurred in the sealing material, depending on whether or not the measured current and the reference current are identical.

20. The method according to claim 19, wherein when the reference current is identical to the measured current, it is determined that a crack did not occur in the sealing material, and when the reference current is not identical to the measured current, it is determined that a crack occurred in the sealing material.

21. The method according to claim 19, wherein the reference current is the preset current.

22. The method according to claim 19, wherein the reference current is a current measured at a previous point of time.

* * * * *